United States Patent
Hammond, Jr. et al.

(10) Patent No.: US 8,202,128 B2
(45) Date of Patent: Jun. 19, 2012

(54) TELECOMMUNICATIONS JACK WITH ADJUSTABLE CROSSTALK COMPENSATION

(75) Inventors: Bernard Harold Hammond, Jr., Cheltenham (GB); David Patrick Murray, Bishopston (GB); Gordon John White, Gloucester (GB); Ian Robert George, Churchdown (GB)

(73) Assignee: ADC GmbH, Berlin (DE)

( * ) Notice: Subject to any disclaimer, the term of this patent is extended or adjusted under 35 U.S.C. 154(b) by 0 days.

(21) Appl. No.: 12/625,224

(22) Filed: Nov. 24, 2009

(65) Prior Publication Data

US 2010/0167589 A1 Jul. 1, 2010

Related U.S. Application Data

(60) Provisional application No. 61/117,869, filed on Nov. 25, 2008.

(51) Int. Cl.
*H01R 24/00* (2006.01)
(52) U.S. Cl. ........................................... 439/676
(58) Field of Classification Search .............. 439/676, 439/941, 76.1; 333/1; 29/876, 872, 873
See application file for complete search history.

(56) References Cited

U.S. PATENT DOCUMENTS

| | | |
|---|---|---|
| 4,190,854 A | 2/1980 | Redfern |
| 4,439,814 A | 3/1984 | Rhodes |
| 4,604,513 A | 8/1986 | Lim |
| 4,792,779 A | 12/1988 | Pond et al. |
| 4,905,358 A | 3/1990 | Einbinder |
| 4,947,020 A | 8/1990 | Imamura et al. |
| 5,299,956 A | 4/1994 | Brownell et al. |
| 5,420,515 A | 5/1995 | Uhling et al. |
| 5,428,204 A | 6/1995 | Uhling et al. |
| 5,446,260 A | 8/1995 | Uhling et al. |
| 5,525,910 A | 6/1996 | Uhling et al. |
| 5,569,398 A | 10/1996 | Sun et al. |
| 5,602,483 A | 2/1997 | Uhling et al. |
| 5,685,995 A | 11/1997 | Sun et al. |
| 5,808,272 A | 9/1998 | Sun et al. |

(Continued)

FOREIGN PATENT DOCUMENTS

DE 196 46 774 5/1998

(Continued)

OTHER PUBLICATIONS

International Search Report and Written Opinion mailed Feb. 17, 2010.

(Continued)

*Primary Examiner* — Alexander Gilman
(74) *Attorney, Agent, or Firm* — Merchant & Gould P.C.

(57) ABSTRACT

Methods and systems for compensating for crosstalk in a telecommunications jack are disclosed. One method includes manufacturing a circuit board having a zone of crosstalk compensation between a first wire pair and a second wire pair, the zone of crosstalk compensation including a capacitive coupling connected between the first wire pair and the second wire pair and a second capacitive coupling selectively connectable in parallel with the capacitive coupling. The method further includes determining a crosstalk value generated by the jack including the manufactured circuit board. The method also includes, upon determining that the crosstalk value is outside of a crosstalk pass band, adjusting the zone of crosstalk compensation by altering an electrical connection between the second capacitive coupling and the capacitive coupling after the circuit board has been manufactured.

20 Claims, 16 Drawing Sheets

U.S. PATENT DOCUMENTS

| | | | |
|---|---|---|---|
| 5,963,111 A | 10/1999 | Anderson et al. | |
| 6,023,200 A | 2/2000 | Rhee | |
| 6,089,923 A | 7/2000 | Phommachanh | |
| 6,310,527 B1 | 10/2001 | Sugawara et al. | |
| 6,333,472 B1 | 12/2001 | Weatherley | |
| 6,428,362 B1 | 8/2002 | Phommachanh | |
| 6,464,541 B1 | 10/2002 | Hashim et al. | |
| 6,875,950 B2 | 4/2005 | Naumov et al. | |
| 6,953,362 B2 | 10/2005 | Mossner et al. | |
| 7,025,621 B2 | 4/2006 | Mossner et al. | |
| 7,401,402 B2 | 7/2008 | Bresche et al. | |
| 7,856,709 B2 | 12/2010 | Bresche et al. | |
| 2003/0171024 A1 | 9/2003 | Mossner et al. | |
| 2007/0123112 A1* | 5/2007 | Caveney et al. | 439/676 |
| 2007/0133185 A1* | 6/2007 | Hashim et al. | 361/777 |

FOREIGN PATENT DOCUMENTS

| | | |
|---|---|---|
| DE | 100 51 097 | 3/2002 |
| EP | 0 525 703 | 2/1993 |
| GB | 2 133 933 | 8/1984 |
| KR | 10 039 4531 | 9/2003 |
| WO | WO 97/02627 | 1/1997 |
| WO | WO 00/55870 | 9/2000 |
| WO | WO 2004/082343 A1 | 9/2004 |

OTHER PUBLICATIONS

Certified English translation of DE 196 46 774 A1, published May 14, 1998, (15 pages including the certification).

* cited by examiner

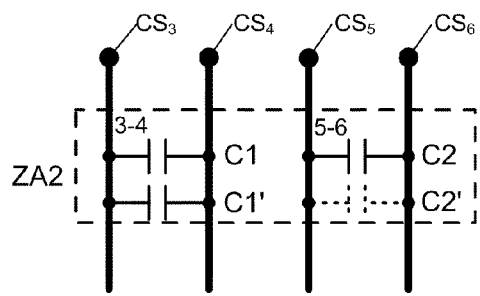
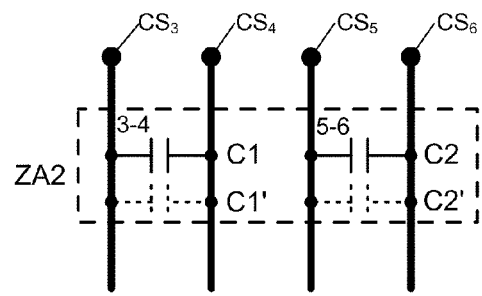
FIG. 9A                FIG. 9B
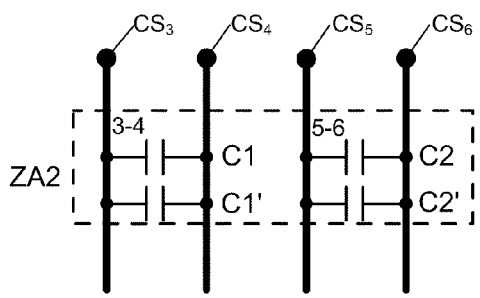
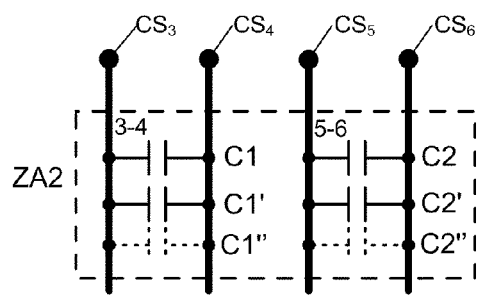
FIG. 9C                FIG. 9D

TELECOMMUNICATIONS JACK WITH ADJUSTABLE CROSSTALK COMPENSATION

CROSS-REFERENCE TO RELATED APPLICATIONS

The present application claims priority to U.S. Provisional Patent Application No. 61/117,869, filed Nov. 25, 2008, the disclosure of which is hereby incorporated by reference in its entirety.

TECHNICAL FIELD

The present disclosure relates generally to telecommunications systems. In particular, the present disclosure relates to a telecommunications jack with adjustable crosstalk compensation.

BACKGROUND OF THE INVENTION

In the field of data communications, communications networks typically utilize techniques designed to maintain or improve the integrity of signals being transmitted via the network ("transmission signals"). To protect signal integrity, the communications networks should, at a minimum, satisfy compliance standards that are established by standards committees, such as the Institute of Electrical and Electronics Engineers (IEEE). The compliance standards help network designers provide communications networks that achieve at least minimum levels of signal integrity as well as some standard of compatibility.

One prevalent type of communication system uses twisted pairs of wires to transmit signals. In twisted pair systems, information such as video, audio and data are transmitted in the form of balanced signals over a pair of wires. The transmitted signal is defined by the voltage difference between the wires.

Crosstalk can negatively affect signal integrity in twisted pair systems. Crosstalk is unbalanced noise caused by capacitive and/or inductive coupling between wires and a twisted pair system. Crosstalk can exist in many variants, including near end crosstalk, far end crosstalk, and alien crosstalk. Near end crosstalk refers to crosstalk detected at the same end of a wire pair as the inductance/capacitance causing it, while far end crosstalk refers to crosstalk resulting from inductance/capacitance at a far end of a wire pair. Alien crosstalk refers to crosstalk that occurs between different cables (i.e. different channels) in a bundle, rather than between individual wires or circuits within a single cable. The effects of all crosstalk become more difficult to address with increased signal frequency ranges.

The effects of crosstalk also increase when transmission signals are positioned closer to one another. Consequently, communications networks include areas that are especially susceptible to crosstalk because of the proximity of the transmission signals. In particular, communications networks include connectors that bring transmission signals in close proximity to one another. For example, the contacts of traditional connectors (e.g., jacks and plugs) used to provide interconnections in twisted pair telecommunications systems are particularly susceptible to crosstalk interference.

FIG. 1 shows a prior art panel 20 adapted for use with a twisted pair telecommunications system. The panel 20 includes a plurality of jacks 22 placed in close proximity with one another. Each jack 22 includes a port 24 adapted to receive a standard telecommunications plug 26. Each of the jacks 22 is adapted to be terminated to four twisted pairs of transmission wires. As shown at FIG. 2, each of the jacks 22 includes eight contact springs labeled as having positions 1-8. In use, contact springs 4 and 5 are connected to a first pair of wires, the contact springs 1 and 2 are connected to a second pair of wires, contact springs 3 and 6 are connected to a third pair of wires, and contact springs 7 and 8 are connected to a fourth pair of wires. As shown at FIG. 3, a typical plug 26 also has eight contacts (labeled 1-8) adapted to interconnect with the corresponding eight contacts of the jack 22 when the plug is inserted within the port 24.

To promote circuit density, the contacts of the jacks and the plugs are required to be positioned in fairly close proximity to one another. Thus, the contact regions of the jacks and plugs are particularly susceptible to crosstalk. Furthermore, certain pairs of contacts are more susceptible to crosstalk than others. For example, in an RJ-45 connector, the first and third pairs (i.e. the 4-5 and 3-6 pairs) of contacts in the plugs and jacks are typically most susceptible to crosstalk.

To address the problems of crosstalk, jacks have been designed with contact spring configurations adapted to reduce the capacitive coupling generated between the contact springs so that crosstalk is minimized. An alternative approach involves intentionally generating crosstalk having a magnitude and phase designed to compensate for or correct crosstalk caused at the plug or jack. Typically, crosstalk compensation can be provided by manipulating the positioning of the contacts or leads of the jack or can be provided on a circuit board used to electrically connect the contact springs of the jack to insulation displacement connectors of the jack. This crosstalk compensation is generally based on the amount of crosstalk generated by the jack in the absence of any crosstalk compensation.

When a number of jacks are manufactured, the generated crosstalk may vary among the jacks. Typically, the jacks of a single production lot will have similar crosstalk properties, but there may exist a wide variance in the crosstalk generated by jacks manufactured in different production runs, or lots. This is due, at least in part, to manufacturing variances among circuit boards between production runs. Therefore, when some type of crosstalk compensation is selected and applied to each jack, that compensation can be less effective than intended, due to the variances between lots. In certain cases, an entire lot of jacks may fall outside of a given specification, because the selected crosstalk compensation does not adequately compensate for the crosstalk generated in that lot of jacks. These circuit boards cannot be used in the manner intended without substantial post-manufacturing adjustment, such as by manually adding or removing compensative elements to the board. Thus, there is a need for further development relating to flexibility of crosstalk remediation.

SUMMARY

In accordance with the present disclosure, the above and other problems are solved by the following:

In a first aspect, a method for compensating for crosstalk generated by one or more of a plurality of wire pairs in a telecommunications jack is disclosed. The method includes manufacturing a circuit board having a zone of crosstalk compensation between a first wire pair and a second wire pair, the zone of crosstalk compensation including a capacitive coupling connected between the first wire pair and the second wire pair and a second capacitive coupling selectively connectable in parallel with the capacitive coupling. The method further includes determining a crosstalk value generated by the jack including the manufactured circuit board. The method also includes, upon determining that the crosstalk value is outside of a crosstalk pass band, adjusting the zone of crosstalk compensation by altering an electrical connection between the second capacitive coupling and the capacitive coupling after the circuit board has been manufactured.

In a second aspect, a crosstalk compensation arrangement for a telecommunications jack is disclosed. The arrangement includes a circuit board, a plurality of contact springs mounted on the circuit board, a plurality of wire termination contacts mounted on the circuit board, and a plurality of tracks on the circuit board that respectively electrically connect the contact springs to the wire termination contacts. The arrangement further includes a crosstalk compensation arrangement including a zone of crosstalk compensation between a first wire pair and a second wire pair, the zone of crosstalk compensation including a capacitive coupling connected between the first wire pair and the second wire pair and a second capacitive coupling selectively connectable in parallel with the capacitive coupling by altering a connection between a via electrically connected to the capacitive coupling and a via electrically connected to the second capacitive coupling.

In a third aspect, a telecommunications jack for use in a twisted pair system is disclosed. The telecommunications jack includes a housing defining a port for receiving a plug, a plurality of contact springs adapted to make electrical contact with the plug when the plug is inserted into the port of the housing, and a plurality of wire termination contacts for terminating wires to the jack. The telecommunications jack also includes a circuit board including conductive tracks that electrically connect the contact springs to the wire termination contacts. The telecommunications jack further includes a crosstalk compensation arrangement including a zone of crosstalk compensation between a first wire pair and a second wire pair, the zone of crosstalk compensation including a capacitive coupling connected between the first wire pair and the second wire pair and a second capacitive coupling selectively connectable in parallel with the capacitive coupling by altering a connection between a via electrically connected to the capacitive coupling and a via electrically connected to the second capacitive coupling.

BRIEF DESCRIPTION OF THE DRAWINGS

FIG. 9A is a schematic diagram showing a portion of the crosstalk compensation scheme of FIG. 9, according to a possible embodiment of the present disclosure;

FIG. 9B is a schematic diagram showing a portion of the crosstalk compensation scheme of FIG. 9, according to a further possible embodiment of the present disclosure;

FIG. 9C is a schematic diagram showing a portion of the crosstalk compensation scheme of FIG. 9, according to a further possible embodiment of the present disclosure;

FIG. 9D is a schematic diagram showing a portion of the crosstalk compensation scheme of FIG. 9, according to a further possible embodiment of the present disclosure;

DETAILED DESCRIPTION

Figure 1:
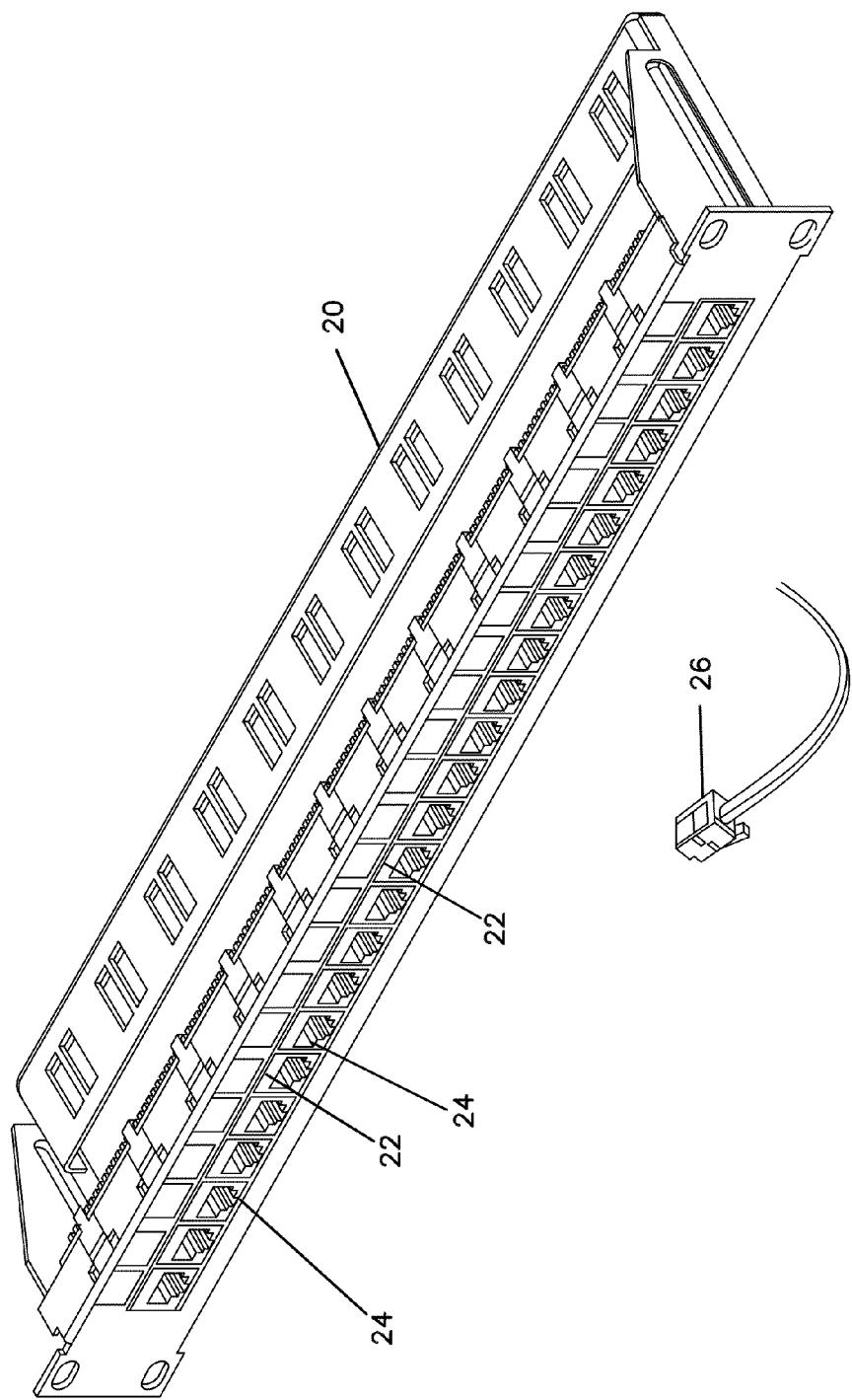
FIG. 1 is a perspective view of a prior art telecommunications panel.
Figure 2:
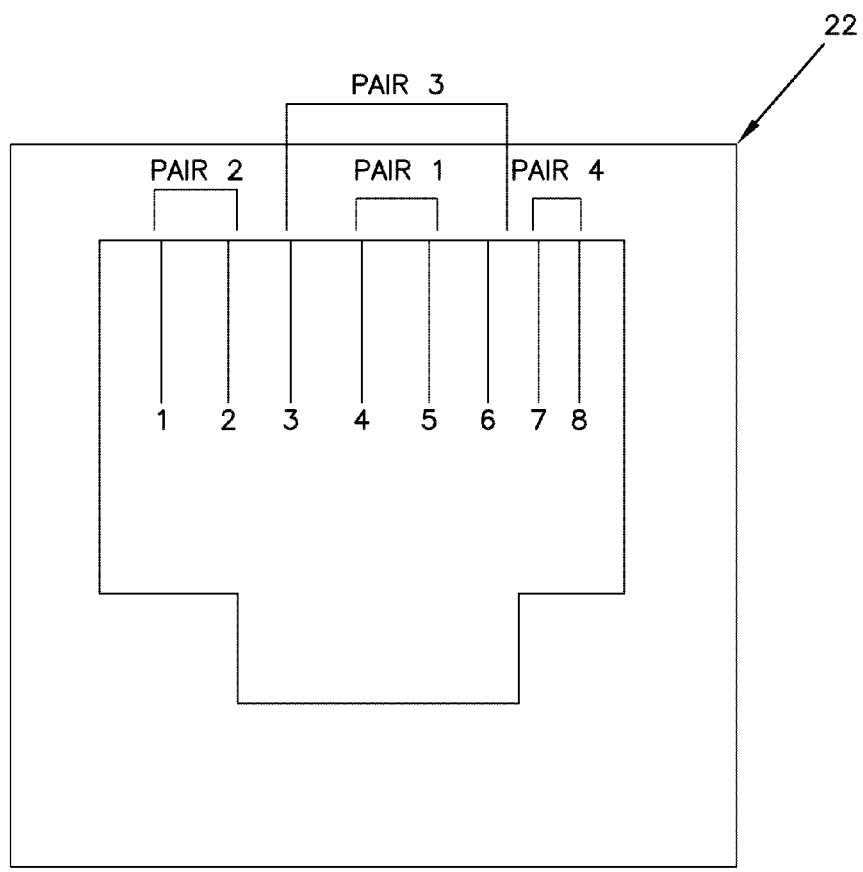
FIG. 2 is a schematic illustration of a prior art jack.
Figure 3:
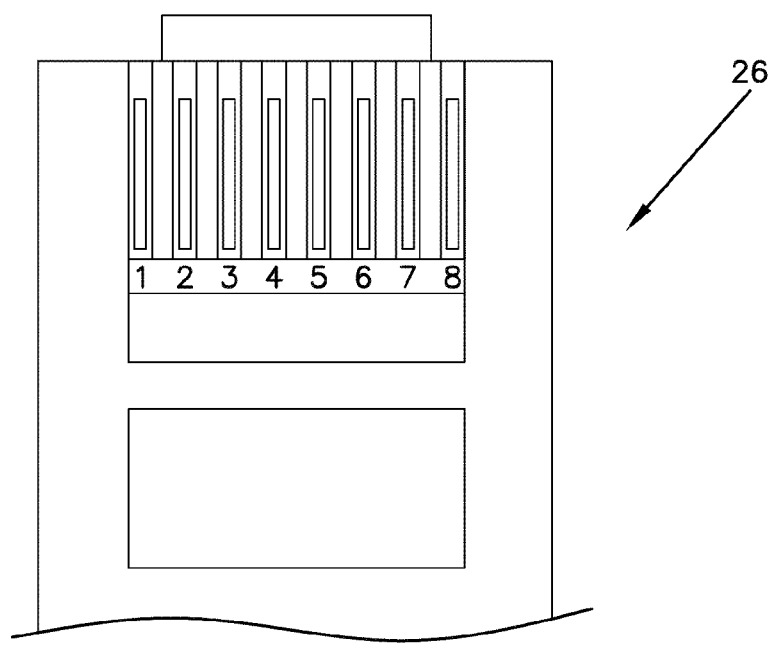
FIG. 3 is a schematic representation of a prior art telecommunications plug.

Various embodiments of the present disclosure will be described in detail with reference to the drawings, wherein like reference numerals represent like parts and assemblies throughout the several views. Additionally, any examples set forth in this specification are not intended to be limiting and merely set forth some of the many possible embodiments for how aspects of the disclosure may be practiced.

In general, the present disclosure relates to methods and systems for improving adjustability of crosstalk compensation within a telecommunications jack. The present disclosure generally describes crosstalk compensation schemes in which crosstalk compensation can be easily adjusted by connecting vias exposed on a circuit board included in the telecommunications jack. In certain aspects, the crosstalk compensation is achieved by testing manufactured circuit boards, and adjusting the crosstalk compensation of the board after manufacturing. The adjustable crosstalk compensation schemes disclosed herein provide a method by which manufacturing variances can be compensated against. This is useful in instances in which a crosstalk pass-band is narrow, and manufacturing variances would otherwise result in a higher failure rate.

The present disclosure relates to selective inclusion of easily connectable/disconnectable capacitive crosstalk compensation elements useable in one or more zones of crosstalk compensation. In certain aspects, the present disclosure relates to fine-tuning of crosstalk compensation in which portions of the crosstalk compensation are located directly between the contact springs of a telecommunications jack.

Figure 4:
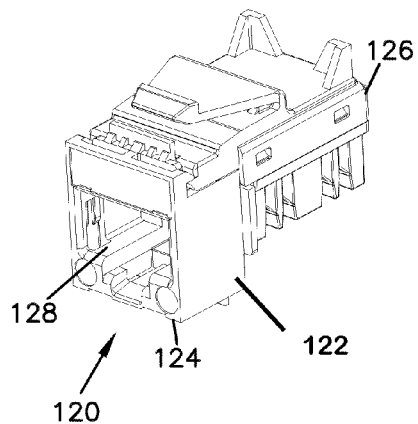
FIG. 4 is a front, perspective view of a telecommunications jack having features that are examples of inventive aspects in accordance with the principles of the present disclosure.
Figure 5:
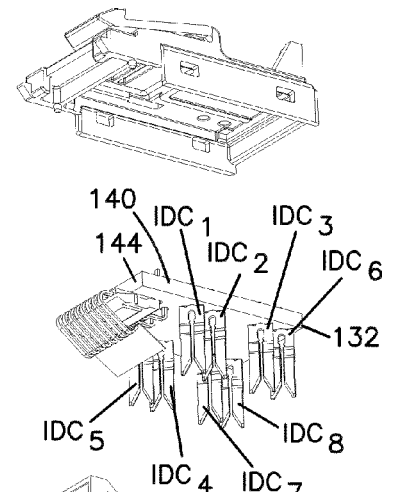
FIG. 5 is an exploded view of the jack of FIG. 4.

FIGS. 4 and 5 show a telecommunications jack 120 (i.e., a telecommunications connector) having features that are examples of aspects of a telecommunications jack in accordance with the principles of the present disclosure. The jack 120 includes a dielectric housing 122 including a front portion 124 and a rear portion 126. The front portion 124 defines a front port 128 sized and shaped to receive a conventional telecommunications plug (e.g., an RJ style plug such as an RJ 45 plug). The rear portion 126 defines an insulation displacement connector interface and includes a plurality of towers 130 adapted to house insulation displacement connector blades/contacts. The jack 120 further includes a circuit board 132 that mounts between the front and rear portions 124, 126 of the housing 122. A plurality of contact springs $CS_1$-$CS_8$ are terminated to a front edge of the circuit board 132 on a front side. A plurality of insulation displacement connector blades $IDC_1$-$IDC_8$ are terminated to a front side of the circuit board 132. The contact springs $CS_1$-$CS_8$ extend into the front port 128 and are adapted to be electrically connected to corresponding contacts provided on a plug when the plug is inserted into the front port 128. The insulation displacement connector blades $IDC_1$-$IDC_8$ fit within the towers 130 of the rear portion 126 of the housing 122. The circuit board 132 has tracks $T_1$-$T_8$ (e.g., tracings, see FIGS. 9-19) that respectively electrically connect the contact springs $CS_1$-$CS_8$ to the insulation displacement connector blades $IDC_1$-$IDC_8$.

In use, wires are electrically connected to the contact springs $CS_1$-$CS_8$ by inserting the wires between pairs of the insulation displacement connector blades $IDC_1$-$IDC_8$. When the wires are inserted between pairs of the insulation displacement connector blades $IDC_1$-$IDC_8$, the blades cut through the insulation of the wires and make electrical contact with the center conductors of the wires. In this way, the insulation displacement connector blades $IDC_1$-$IDC_8$, which are electrically connected to the contact springs $CS_1$-$CS_8$ by the tracks on the circuit board, provide an efficient means for electrically connecting a twisted pair of wires to the contact springs $CS_1$-$CS_8$ of the jack 120.

Typically, in a jack signals carried at the contact springs $CS_1$-$CS_8$ generate a large portion of the overall crosstalk of the jack. In certain embodiments of the crosstalk compensation schemes disclosed herein, a first zone of capacitive crosstalk compensation can be applied directly between the contact springs $CS_1$-$CS_8$ to ensure that the first zone of crosstalk compensation is placed as close as possible to the location at which crosstalk is generated.

Figure 6:
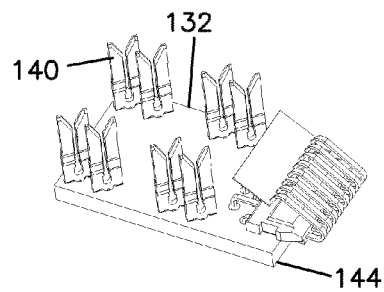
FIG. 6 is a perspective view of the circuit board, insulation displacement connectors and contact springs of the telecommunications jack of FIG. 4.
Figure 6:
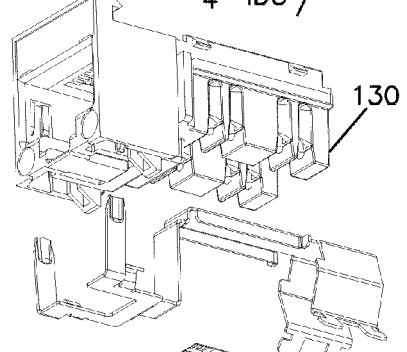
Figure 7:
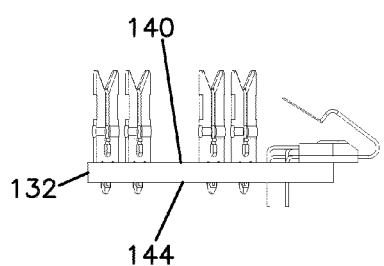
FIG. 7 is a side view of the circuit board, contact springs and insulation displacement connectors of FIG. 6.
Figure 8:
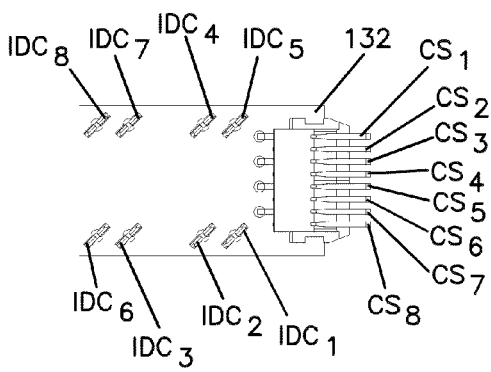
FIG. 8 is a top view of the circuit board and contact springs of FIG. 6.

The contact springs $CS_1$-$CS_8$ are shown more clearly in FIGS. 6-8. The relative positioning, shape and curvature of the contact springs $CS_1$-$CS_8$ is preferably adapted to provide some initial crosstalk compensation at the jack 120.

The circuit board 132 of the jack 120 is preferably a multiple layer circuit board. The circuit board 132 can include a number of conductive layers, separated by alternating dielectric layers. The conductive layers can include the outermost layers on each side of the circuit board, as well as internal layers separated by the dielectric layers. The contact springs $CS_1$-$CS_8$ are mounted generally in the center of the circuit board, while insulation displacement connector blades $IDC_1$-$IDC_8$ are mounted at opposed ends of the board. Vias extend through the dielectric layers to provide electrical connections between the conductive layers. Tracks pass along and at least partially define the conductive layers.

In certain embodiments, the circuit board preferably includes structures for compensating for crosstalk that occurs at the jack/plug interface. In certain embodiments, the structures for compensating for crosstalk include capacitive couplings provided between conductive layers. In certain embodiments, the capacitive couplings are provided by sets of interdigitated fingers placed at the same conductive layer. In other embodiments, opposing plates can be included in adjacent conductive layers of the circuit board. In such embodiments, the magnitude of the capacitive coupling provided between the capacitive plates can be increased through use of a thin dielectric layer between the conductive layers of the circuit board. Example specific crosstalk compensation configurations are described below.

In certain embodiments, one or more of the dielectric layers can be made of a material having a relatively low dielectric constant. As used herein, dielectric constants are dielectric constants relative to air. In certain embodiments, the dielectric constant of certain dielectric layers in the circuit board 132 can be equal to or less than about 5. In other embodiments, the dielectric constant can be less than or equal to about 4 or less than or equal to about 3. An example material for manufacturing dielectric layers is a flame resistant 4 (FR-4) circuit board material. FR-4 circuit board material is a composite of a resin epoxy reinforced with a woven fiberglass mat.

In certain further embodiments of the present disclosure, the dielectric layers of the circuit board 132 can include dielectric layers of varying thickness. For example, in certain embodiments a dielectric layer can have a thickness less than about 0.01 inches, or less than about 0.0075 inches, or less than about 0.005 inches, or less than 0.003 inches. In other embodiments, the thickness can be in the range of 0.001 inches to 0.003 inches or in the range of 0.001 inches to 0.005 inches. In a preferred embodiment, the thickness of one or more of the dielectric layers is about 0.002 inches. In such embodiments, another dielectric layer can be at least 2.5 times thicker, or at least five times thicker. In still other embodiments, one of the dielectric layers is at least 10 times or at least 20 times thicker than another dielectric layer. In one example embodiment, the thickness of such a layer is in the range of 0.050 inches to 0.055 inches. In another example embodiment, the thickness of such a layer is in the range of 0.040 inches to 0.050 inches.

Furthermore, the various dielectric layers can be manufactured of different materials, having different properties. For example, the various dielectric layers can have differing dielectric constants, with one of the layers having a much greater dielectric constant (e.g., at least 1.5 times or at least 2 times greater) than a second layer.

Figure 9:
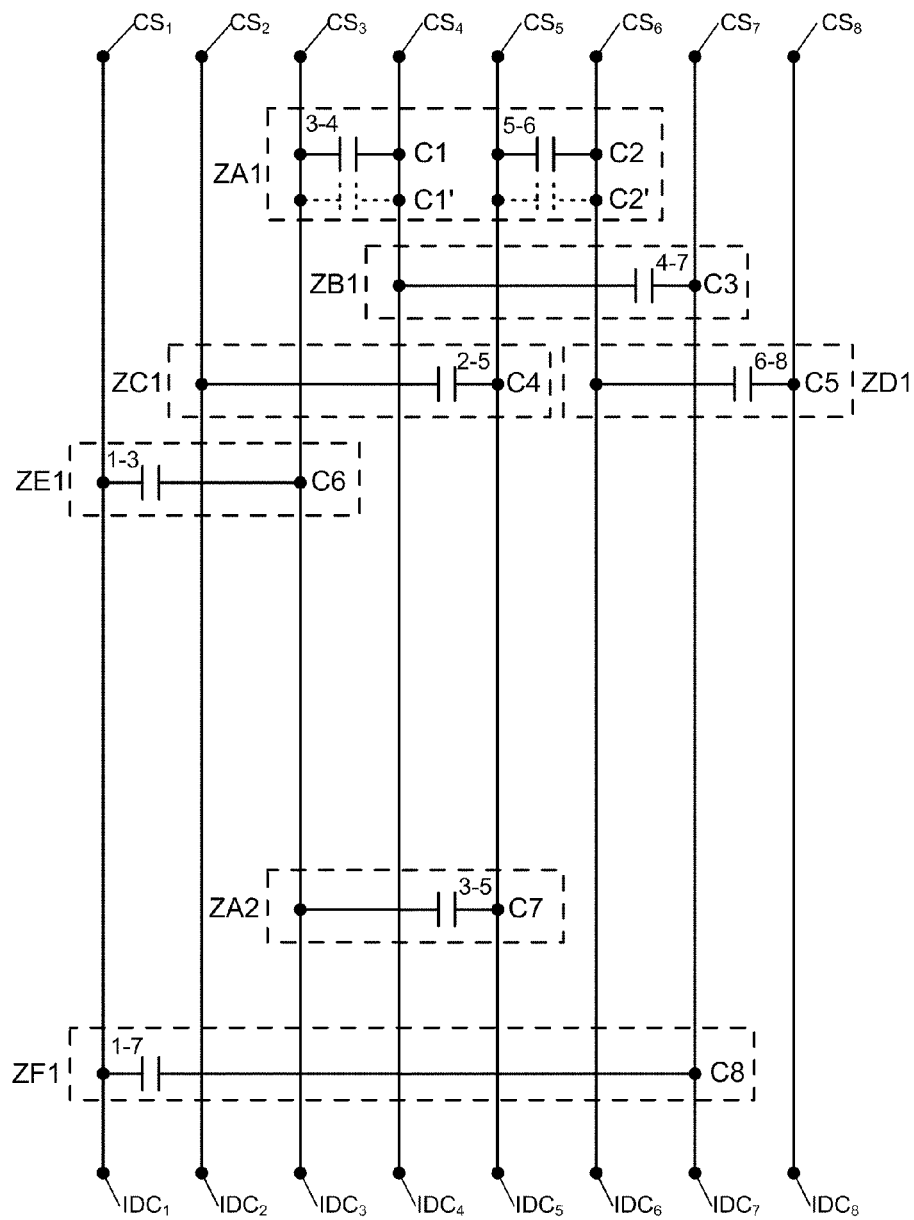
FIG. 9 is a schematic diagram showing a crosstalk compensation scheme incorporated into the telecommunications jack of FIG. 4.

Now referring to FIG. 9, the circuit board 132 includes a number of capacitive couplings having magnitudes and locations adapted to compensate for near end crosstalk and far end crosstalk. These forms of crosstalk are particularly problematic between the 4-5 and 3-6 pairs. To compensate for near end crosstalk between the 4-5 and 3-6 pairs, interdependent zones of compensation are used between tracks $T_{4-5}$ and tracks $T_{3-6}$. A first zone of compensation, called $Z_{A1}$, is located directly on the contact springs, and is not shown herein due to its presence off of the circuit board. As shown at FIG. 9, two additional crosstalk compensation zones are included, and shown as a second zone of compensation $Z_{A2}$ and a third zone of compensation $Z_{A3}$. The first zone of compensation $Z_{A1}$ (not shown) can include a capacitive coupling between track $T_3$ and track $T_5$ and/or a capacitive coupling between track $T_4$ and track $T_6$. The second zone of compensation $Z_{A2}$ includes a capacitive coupling C1 between track $T_3$ and track $T_4$, and a capacitive coupling C2 between track $T_5$ and track $T_6$. The third zone of compensation $Z_{A3}$ includes a capacitive coupling C7 between track $T_3$ and track $T_5$.

Additional zones of crosstalk compensation exist among the other pairs as well. Zone $Z_{B1}$ includes a capacitor C3 between track $T_4$ and $T_7$, thereby providing compensation between the 4-5 and 7-8 pairs. Zone $Z_{C1}$ includes a capacitor C4 between track $T_2$ and $T_5$, thereby providing compensation between the 1-2 and 4-5 pairs. Zone $Z_{D1}$ includes a capacitor C5 between track $T_6$ and $T_8$, thereby providing compensation between the 3-6 and 7-8 pairs. Zone $Z_{E1}$ includes a capacitor C6 between track $T_1$ and $T_6$, thereby providing compensation between the 1-2 and 3-6 pairs. Finally, zone $Z_{F1}$ includes a capacitor C8 between track $T_1$ and $T_7$, thereby providing compensation between the 1-2 and 7-8 pairs. Additional zones of crosstalk can be incorporated as well, as required to reach a desired level of crosstalk compensation across all pairs on the circuit board.

Referring back to the capacitive coupling between the 4-5 and 3-6 pairs, in the embodiment shown, additional capacitive couplings C1' and C2' can be added to the circuit formed in zone of compensation $Z_{A2}$ after the circuit board is manufactured. As detailed below, capacitive coupling C1' can be connected in parallel with capacitive coupling C1, and capacitive coupling C2' can be connected in parallel with capacitive coupling C2. When manufactured, the capacitive coupling C1' or C2' can remain disconnected from capacitive coupling C1 or C2, respectively, but vias (illustrated in FIGS. 11-19, described below) that are manufactured into the circuit board in close proximity to each other can be used to provide a solder, jumpered, or other conductive connection to close the circuit including the additional capacitive coupling (C1' or C2', respectively). In the embodiment shown, capacitive couplings C1' and C2' generally provide less capacitive coupling than C1 and C2, and are of a generally similar or same value. However, other embodiments in which capacitive couplings C1' and C2' have different capacitive values could be used as well.

Referring now to FIGS. 9A-9D, certain possible arrangements of capacitive compensation are shown for zone of compensation $Z_{A2}$ of FIG. 9. FIG. 9A illustrates an arrangement in which two selectively included capacitors (shown as couplings C1' and C2') are placed in parallel with primary capacitive couplings C1 and C2. In FIG. 9A, one of the capacitive couplings (shown as coupling C1') is initially manufactured such that it is initially connected as part of the capacitive compensation of zone $Z_{A2}$, such that, after manufacturing either that capacitive element can be disconnected if less capacitive compensation is required, or the second capacitive coupling can be connected in case additional capacitive compensation is required.

FIG. 9B illustrates a second possible arrangement, in which neither of the first or second additional capacitive coupling C1' or C2' are connected during manufacturing to form a portion of the zone of compensation $Z_{A2}$. In this arrangement, the manufactured compensation scheme may be said to intentionally undershoot the intended target value of crosstalk compensation which would put the overall crosstalk within the pass-band of acceptable values. Following manufacturing, a technician can then choose to test the crosstalk of the overall circuit arrangement, and then connect one or both of the previously unconnected additional capacitive crosstalk compensation elements C1' and C2' to reach a desired crosstalk compensation level in zone of compensation $Z_{A2}$.

FIG. 9C illustrates a third possible arrangement in which both of the first and second additional capacitive couplings C1' and C2' are connected during manufacturing to form a portion of the zone of compensation $Z_{A2}$. In this arrangement, the manufactured compensation scheme is said to intentionally overshoot the intended target value of crosstalk compensation that resides within the pass-band of acceptable crosstalk values. Following manufacturing of such an overshoot arrangement, a technician can choose to test the crosstalk of the overall circuit arrangement and then disconnect one or both of the previously connected capacitive crosstalk compensation elements C1' and C2' to reach the desired crosstalk compensation level.

FIG. 9D illustrates an arrangement in which more than a single additional crosstalk element is included across each wire pair in the zone of compensation $Z_{A2}$. In this arrangement, two selectively connected capacitive elements are connectable in parallel with primary capacitive elements C1 and C2. Capacitive elements C1' and C1" are connected in parallel with capacitive element C1, and elements C2' and C2" are connected in parallel with capacitive element C2. Although only two additional capacitive elements are shown in parallel with each of the primary capacitive elements, additional capacitive elements could be included as well. Furthermore, and as shown with the arrangements of FIGS. 9A-9C, these additional capacitive elements can be manufactured such that any combination of these elements can be initially connected during manufacture. After manufacture, a technician can test the crosstalk generated by the jack, and then certain elements can be connected or disconnected to provide for the desired level of crosstalk.

In further embodiments of the capacitive compensation arrangement of FIG. 9D, additional secondary capacitive compensation can be added in parallel to capacitive couplings C1 and C2, or otherwise between the 3-6 and 4-5 pairs. In the example configuration described above in conjunction with FIG. 9D, an additional pair of vias are included connecting a third capacitive coupling (e.g. interdigitated fingers or a discrete capacitor) C1" in parallel with capacitive coupling C1 and C1', and a similar capacitive coupling C2" could be connected in parallel with capacitive couplings C2 and C2'. However, in other embodiments, additional parallel capacitive couplings could be included as well. In these arrangements, even or odd numbers of capacitive couplings can be included for selective coupling to the 3-6 and 4-5 pairs according to the methods described below. These additional capacitive couplings can, in various embodiments, include a larger or smaller capacitance than capacitors C1, C1', C2, and C2', allowing for larger or finer-granularity adjustment of crosstalk compensation.

It is also understood that the techniques described in conjunction with zone of compensation $Z_{A2}$ are equally applicable to other zones of compensation or other capacitive crosstalk compensation arrangements.

Figure 10A:
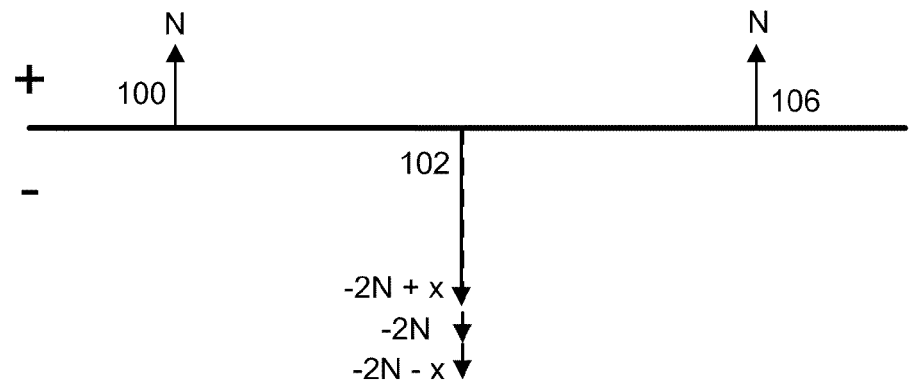
FIG. 10A is a schematic vector diagram showing a compensation arrangement used to provide crosstalk compensation between the 4-5 and 3-6 pairs of the telecommunications jack of FIG. 4.
Figure 10B:
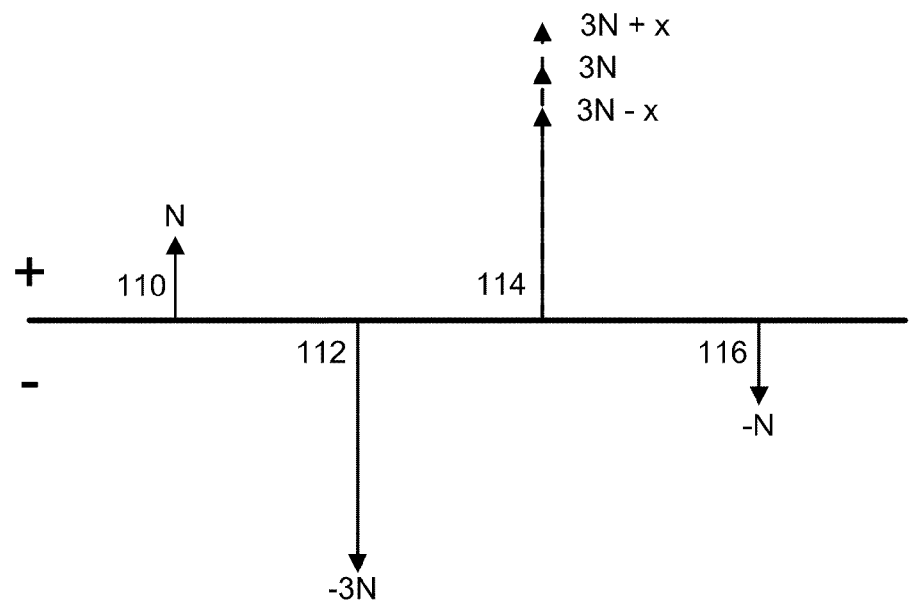
FIG. 10B is a schematic vector diagram showing a further example compensation arrangement useable to provide crosstalk compensation between the 4-5 and 3-6 pairs of the telecommunications jack of FIG. 4.

FIGS. 10A-B provide schematic diagrams representative of possible compensation arrangements between the 4-5 and 3-6 pairs. FIG. 10A is a schematic diagram representative of a two-stage compensation arrangement used to provide crosstalk compensation between the 4-5 and 3-6 pairs as illustrated in FIG. 9 and FIGS. 9A-9D, described above. As shown at FIG. 10A, the compensation arrangement includes a first vector 100, a second vector 102, and a third vector 104. The first vector 100 and the third vector 104 have positive polarities, while the fourth vector 106 has negative polarity. The first vector 100 has a magnitude of M and corresponds to crosstalk introduced at the plug. The second vector 102 has a magnitude of about −2 M and corresponds to the overall crosstalk introduced at the first zone of crosstalk compensation $Z_{A1}$ provided by adjustable compensation elements provided on a circuit board. The second vector 102 provides adjustable levels of overall crosstalk introduced at the second zone of compensation $Z_{A1}$ (e.g. formed by C1, C2, and optionally C1' and/or C2'). The third vector 104 has a magnitude of about M and corresponds to an overall crosstalk introduced at a second zone of compensation $Z_{A2}$ (e.g. formed by C7). It will be appreciated that each vector is a lump sum of the total crosstalk or crosstalk compensation provided at each respective compensation zone, with the vectors being placed at the centers or midpoints of the compensation zones.

In designing the compensation scheme of FIG. 10A, a number of factors are taken into consideration when determining the placement of the compensation zones. One factor includes the need to accommodate signal travel in both directions (i.e., in forward and reverse directions) through the tracks on the circuit board. To accommodate forward and reverse transmissions through the circuit board, the compensation scheme preferably has a configuration with forward and reverse symmetry. It is also desirable for the compensation scheme to provide optimized compensation over a relatively wide range of transmission frequencies. For example, in one embodiment, performance is optimized for frequencies ranging from 1 MHz to 500 MHz. It is further desirable for the compensation arrangement to take into consideration the phase shifts that occur as a result of the time delays that take place as signals travel between the zones of compensation.

To minimize the effect of phase shift in the compensation arrangement, it is preferred for the second vector 102 to be positioned as close as possible to the first vector 100. By placing the zone of compensation $Z_{A1}$ near the source of crosstalk, phase shift effects are minimized, allowing less capacitive coupling to be used in subsequent crosstalk compensation stages. Therefore, although in FIG. 10A certain relative crosstalk values are shown, other capacitive coupling levels can be used which provide less coupling than this, while still maintaining adequate crosstalk compensation across the target frequency range.

FIG. 10B illustrates a second possible compensation arrangement using three zones of crosstalk compensation between the 3-6 and 4-5 pairs. In this arrangement, the compensation arrangement includes a first vector 110, a second vector 112, a third vector 114, and a fourth vector 116. The first vector 110 has a magnitude M and corresponds to crosstalk introduced at the plug. The second vector 112 has a magnitude of about −3 M and corresponds to the overall crosstalk introduced at the first zone of crosstalk compensation provided by compensation elements applied to a circuit board or on contact springs (e.g., to place those elements closer to the source of compensation, as explained above). The third vector 114 has a magnitude of about 3 M and corresponds to overall crosstalk introduced at a second zone of compensation provided by adjustable compensation elements disposed on a circuit board, as described below. The fourth vector 116 has a magnitude of about M and corresponds to a further zone of crosstalk compensation placed on the circuit board.

It will be appreciated that each vector is a lump sum of the total crosstalk or crosstalk compensation provided at each respective compensation zone, with the vectors being placed at the centers or midpoints of the compensation zones.

It is noted that the adjustable crosstalk compensation elements could be placed at different zones of crosstalk compensation as well, and could be used in crosstalk compensation arrangements including more or fewer stages of crosstalk compensation.

Figure 11:
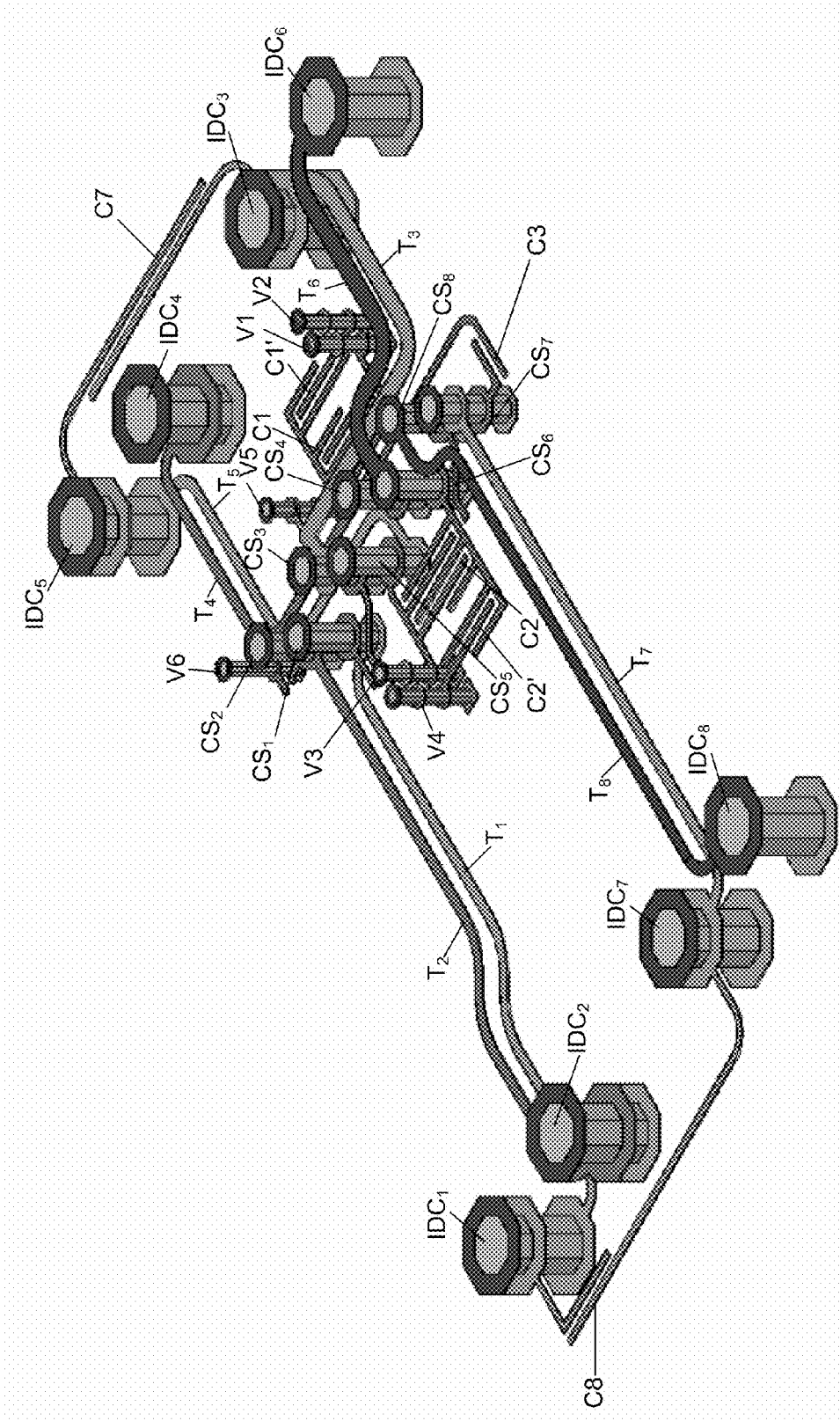
FIG. 11 is a perspective view of metal layers in a circuit board useable in the telecommunications jack of FIG. 4.
Figure 12:
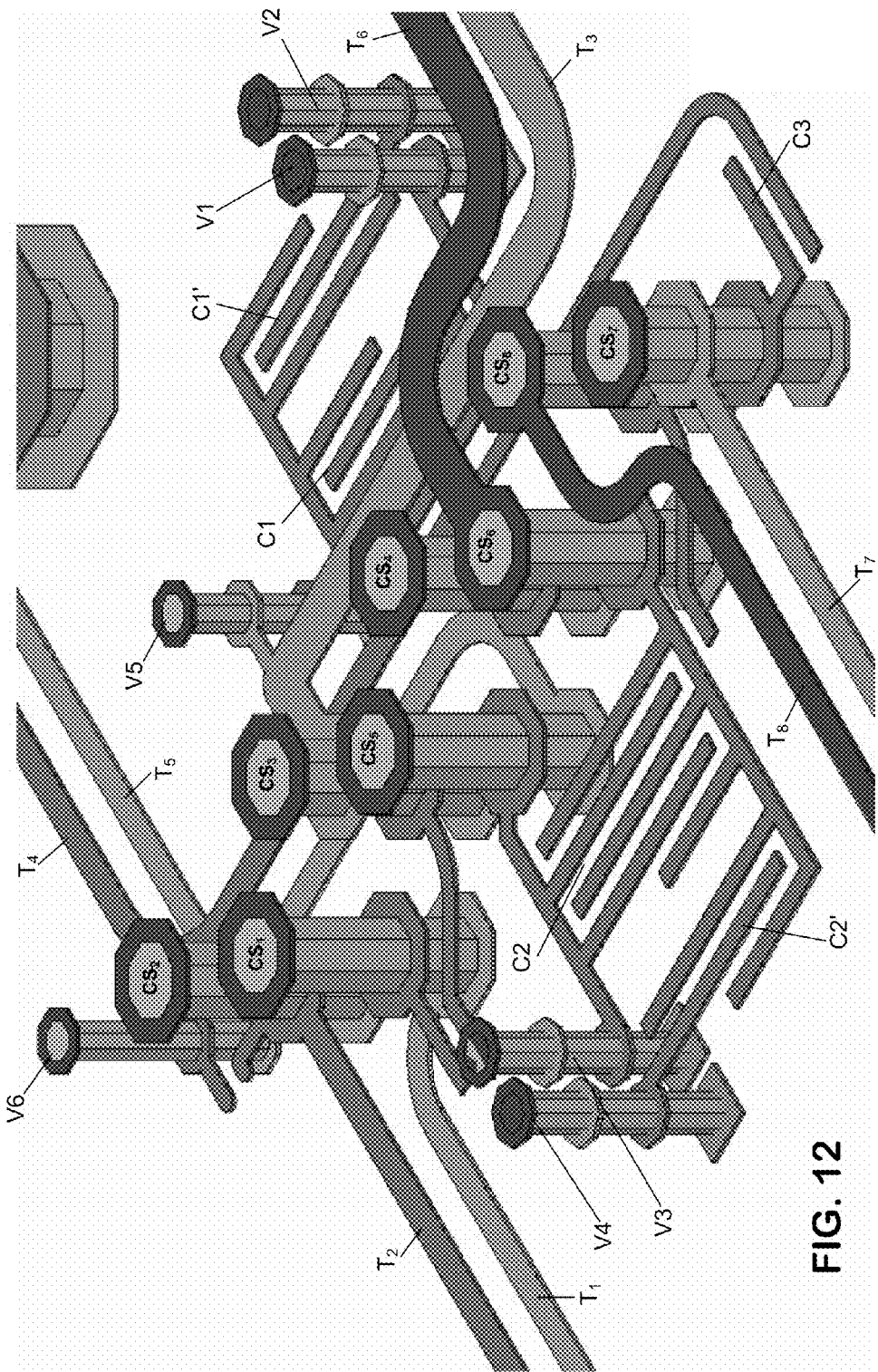
FIG. 12 is a perspective view of a portion of the circuit board of FIG. 11.
Figure 13:
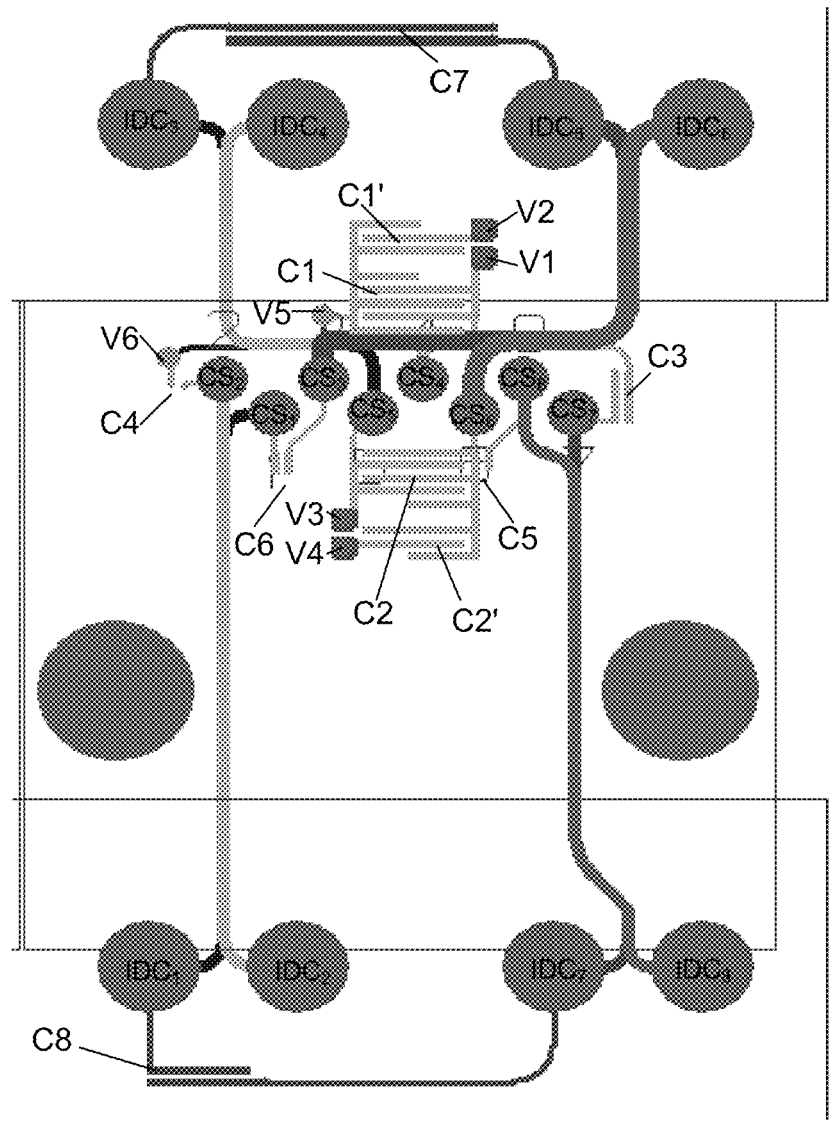
FIG. 13 is a tracing overlay view of the circuit board used in the telecommunications jack of FIG. 4.

FIGS. 11-19 illustrate an example circuit board layout for implementing the compensation arrangement of FIG. 9. FIGS. 11-12 provide a three-dimensional, perspective view of the conductive paths within the circuit board 132, while FIG. 13 illustrates a circuit board design showing the routing of conductive paths through each of four conductive layers of the circuit board 132 in a possible embodiment of the present disclosure. As shown, the tracks $T_1$-$T_8$ are routed from the contact springs to the insulation displacement connectors in coupled pairs on adjacent conductive layers of the circuit board. Specifically, tracks $T_1$ and $T_2$ are placed on first and second conductive layers, respectively, and are routed along a similar path. Similarly, tracks $T_3$ and $T_6$ are routed together from $CS_3$ and $CS_6$ to $IDC_3$ and $IDC_6$; tracks $T_4$ and $T_5$ are routed together from $CS_4$ and $CS_5$ to $IDC_4$ and $IDC_5$; and tracks $T_7$ and $T_8$ are routed together from $CS_7$ and $CS_8$ to $IDC_7$ and $IDC_8$.

Capacitive couplings C1, C1', C2, and C2' are, in the embodiment shown, each located on the third conductive layer. Capacitive coupling C1 is connected to a via V1 which passes through all of the layers of the circuit board and is exposed at the top and bottom sides of the board. Capacitive coupling C1' is connected to a via V2, which passes through all of the layers of the circuit board and is exposed at the top and bottom sides of the board at a location near to via V1. Capacitive coupling C1' can be included into the circuit forming zone of compensation $Z_{A2}$ by electrically connecting the vias V1 and V2, causing capacitive couplings C1 and C1' to be connected in parallel. By exposing the vias V1 and V2 externally to the circuit board 132, the overall capacitive coupling included in zone $Z_{A2}$ can be varied after the circuit board is manufactured.

Capacitive couplings C2 and C2' are connected to vias V3 and V4, respectively, which are also located near to each other on the circuit board and exposed to external sides of the board. Therefore, capacitive coupling C2' can also be added to the crosstalk compensation arrangement after manufacturing of the circuit board 132 by electrically connecting vias V3 and V4.

Vias V5 and V6 allow connection of discrete electrical components to the circuit board, such as additional discrete capacitive compensation. In the embodiment shown, via V5 allows connection of $CS_3$ (by way of Track $T_3$) to capacitors C1 and C1', thereby assisting in accomplishing the capacitive coupling between the 3-6 and 4-5 pairs. via V6 allows connection of track $T_5$ to capacitor C4, providing capacitive coupling between the 4-5 and 1-2 pairs.

Figure 14:
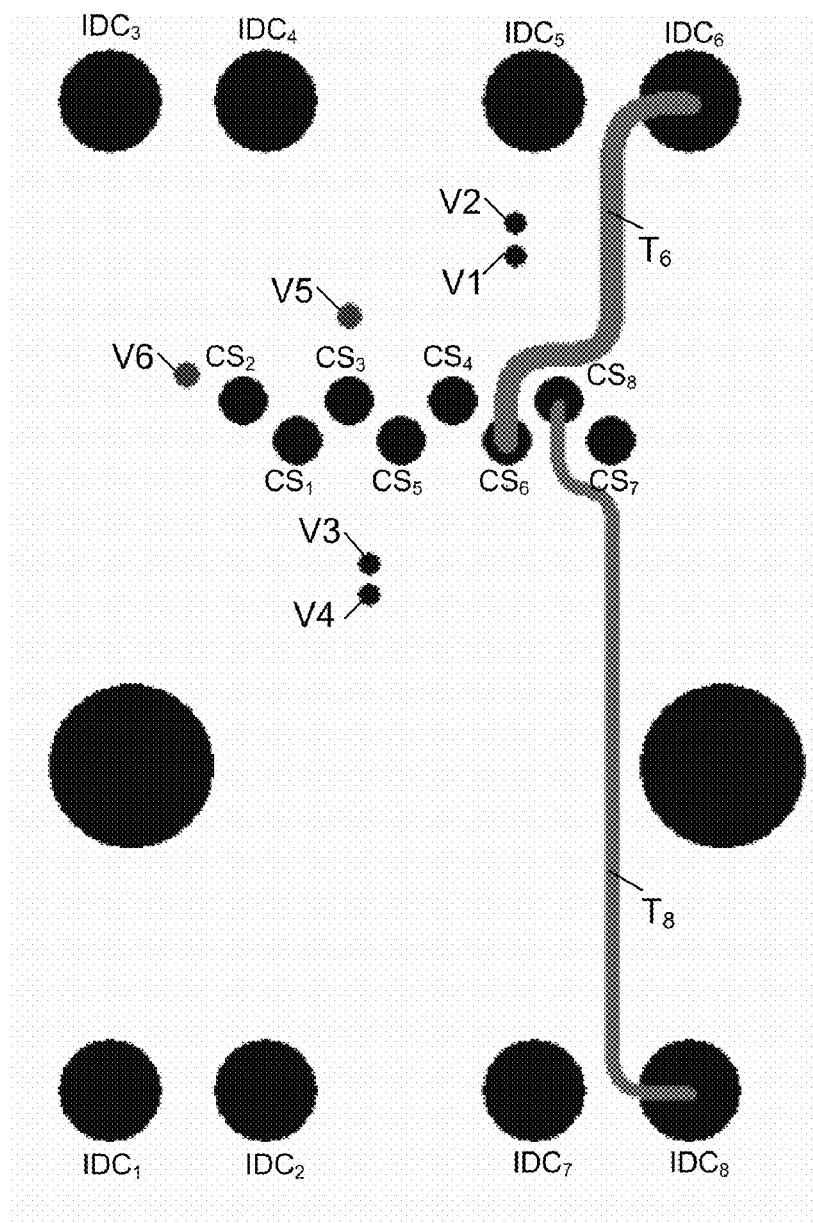
FIG. 14 shows a first conductive layer of the circuit board of FIG. 11.
Figure 15:
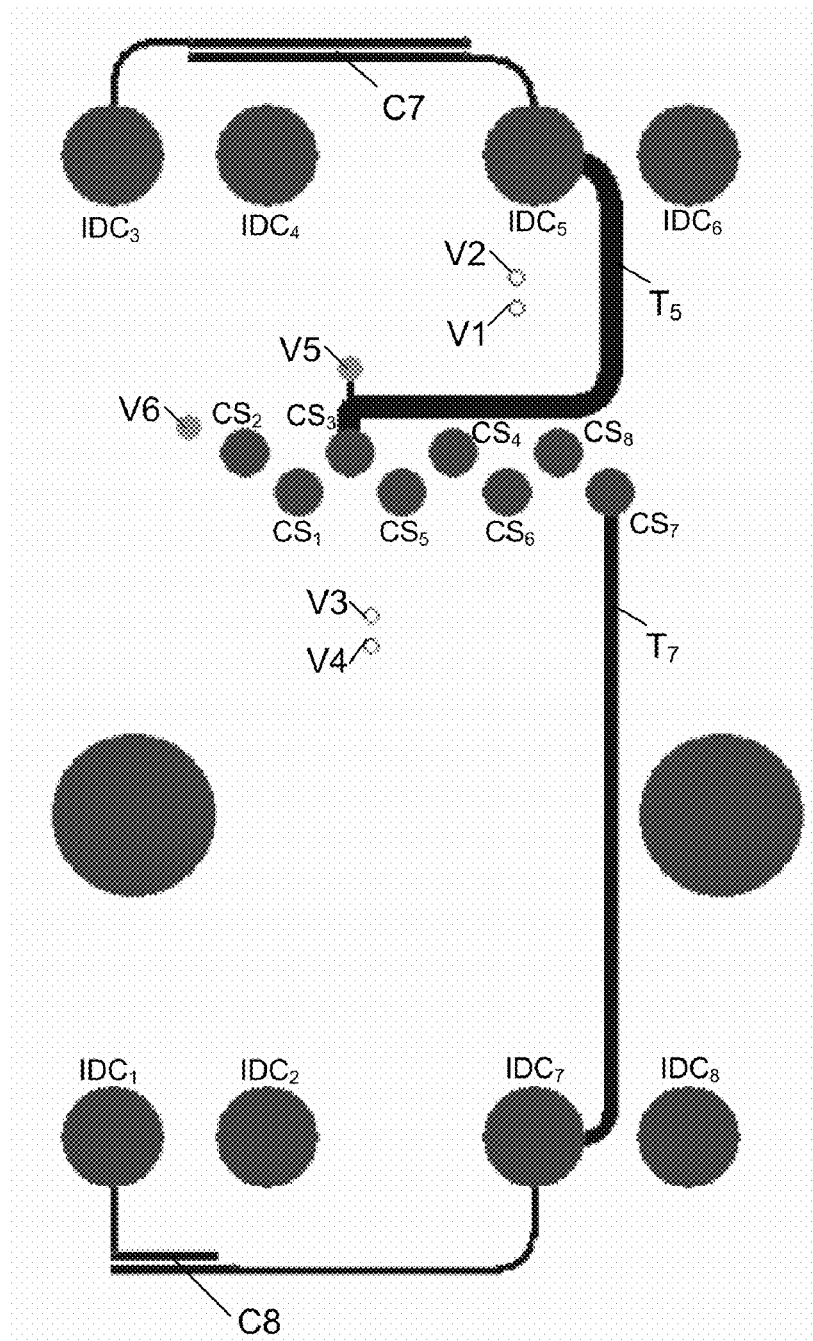
FIG. 15 shows a second conductive layer of the circuit board of FIG. 11.
Figure 16:
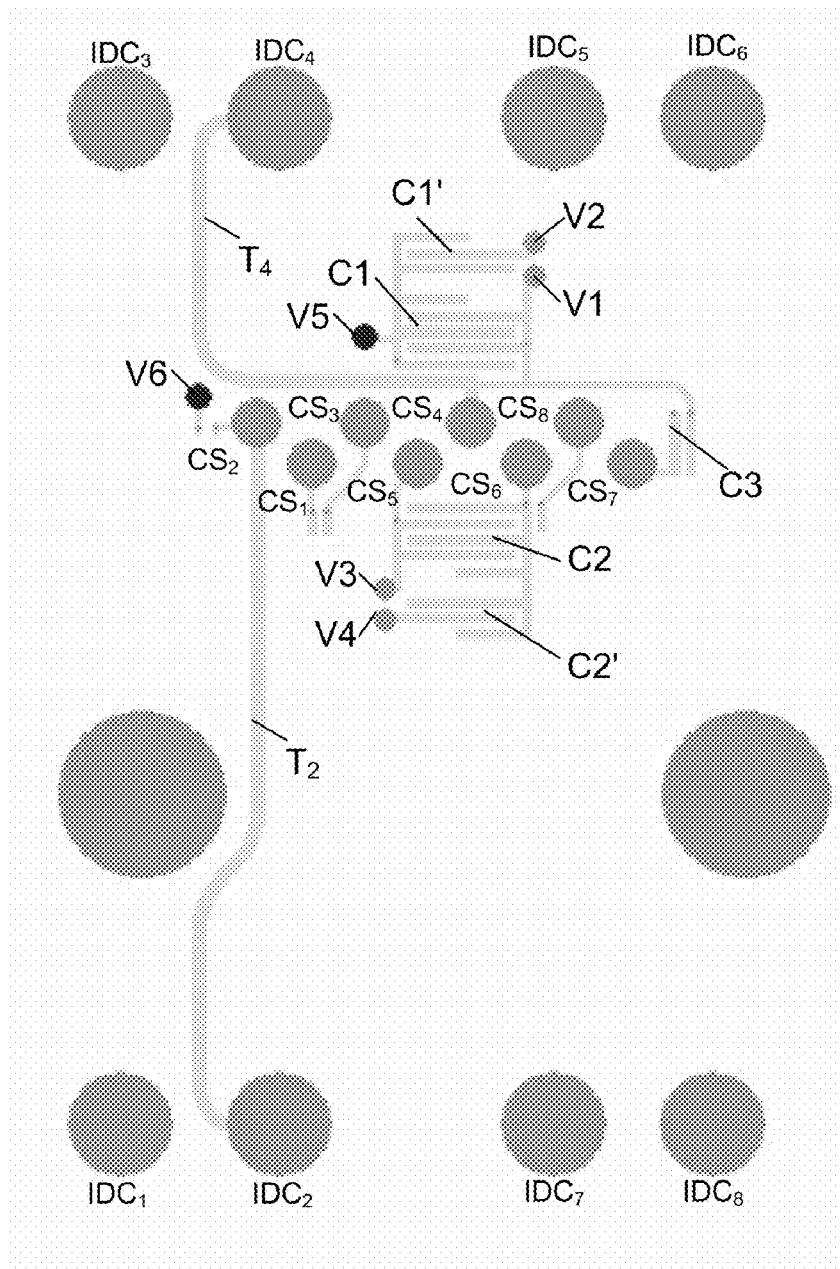
FIG. 16 shows a third conductive layer of the circuit board of FIG. 11.
Figure 17:
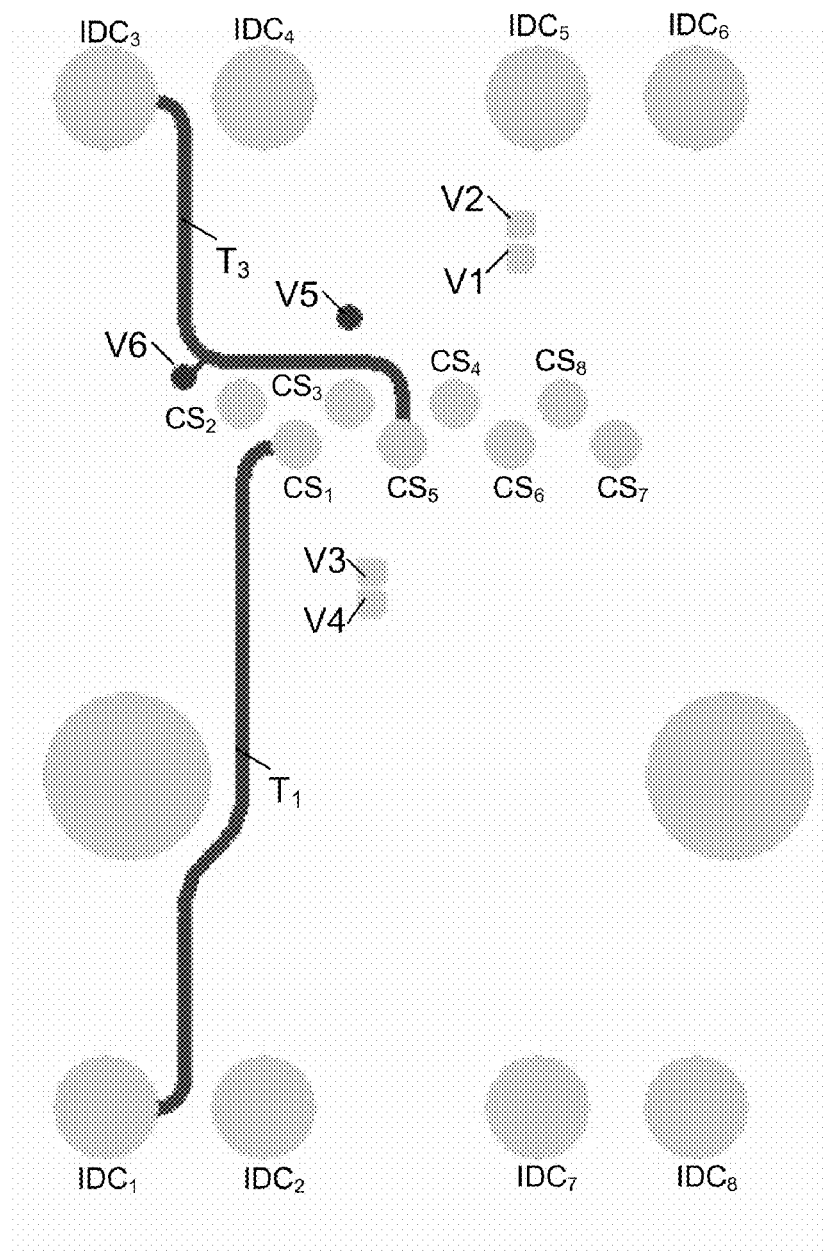
FIG. 17 shows a fourth conductive layer of the circuit board of FIG. 11.

FIGS. 14-17 show the conductive paths in each of the four individual conductive layers of the circuit board shown in FIG. 13. FIG. 14 shows the conductive paths existing at a top layer of the circuit board 132. FIG. 15 illustrates the conductive paths existing at a second layer of the circuit board, separated from the top layer of the circuit board by a dielectric layer. FIG. 16 illustrates the conductive paths existing at a third layer of the circuit board 132, which resides below the layer shown in FIG. 15 and separated by a second dielectric layer. FIG. 17 illustrates the conductive paths existing at a bottom layer of the circuit board 132, which resides below the layer shown in FIG. 16 and separated by a third dielectric layer.

Figure 18:
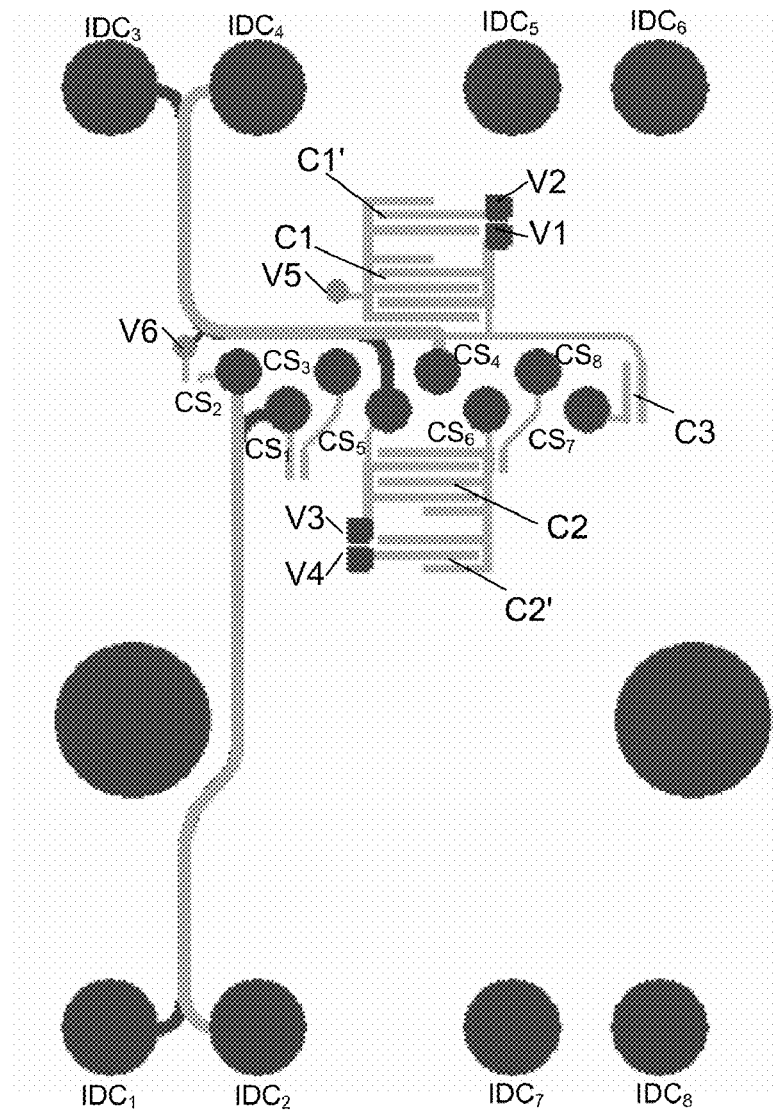
FIG. 18 shows compensation and capacitances for the 4-5 and 3-6 pairs in the circuit board of FIG. 11.
Figure 19:
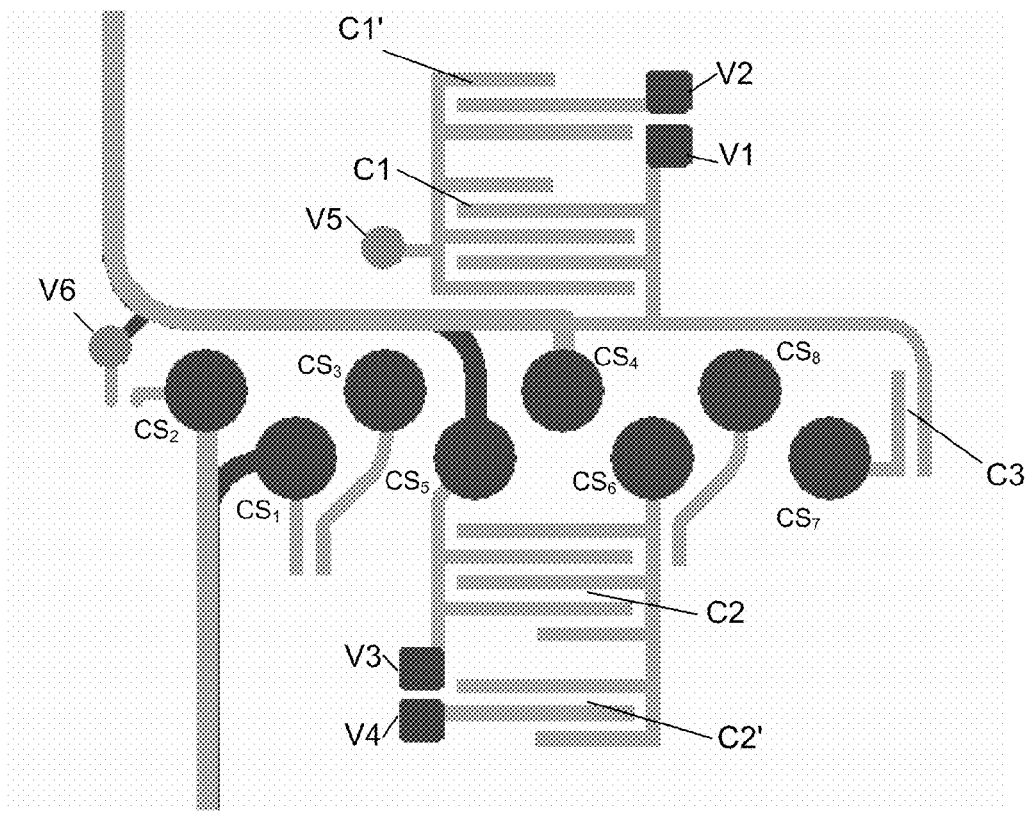
FIG. 19 is a close-up view of a portion of the compensation and capacitance routing of FIG. 18.

FIGS. 18-19 illustrate the compensating capacitances present in the third and fourth conductive layers of the circuit board of FIG. 13 (i.e. FIGS. 16-17), in which a majority of the routing of components providing capacitive compensation between the 3-6 and 4-5 pairs are located.

Various manufacturing and routing techniques may be implemented in the placement of the tracks, vias, and capacitors described herein. Additional details regarding the routing and placement of circuit components are described in U.S.

patent application Ser. No. 11/402,544, filed Apr. 11, 2006, which was previously incorporated by reference in its entirety.

Furthermore, in the embodiments of the present disclosure, certain of the capacitive couplings C1-C8 are represented as interdigitated fingers arranged to provide a wire-to-wire capacitive coupling between tracks in the communications jack. Others of the capacitive couplings are represented by near-proximity wire extensions (e.g. C3, C7, and C8), again providing wire-to-wire capacitive coupling. Still other capacitive couplings are accomplished by use of discrete capacitors mounted on the circuit board (e.g. C4, C5, and C6). In other embodiments contemplated, the capacitive couplings can take other forms. For example, the interdigitated fingers could be replaced by discrete capacitive elements to similar effect. Further, the discrete capacitors could be replaced by wire-to-wire capacitive couplings. Other arrangements are possible as well.

Referring now to FIGS. 9-19 generally, a number of methods of tuning the circuit board 132 for crosstalk compensation are possible. It is noted that, in conjunction with manufacturing the circuit board, crosstalk generated at the jack, and crosstalk compensation generated at the jack, can vary, typically on a lot by lot basis. For example, one manufactured run of circuit boards will have a first set of similar crosstalk and crosstalk compensation values, such that the lot will generate similar crosstalk values. However, due to manufacturing variances, a subsequent lot will generate a different crosstalk value. Therefore, in one possible embodiment (e.g. as shown in FIG. 9A), the circuit board 132 is manufactured such that one of the pairs of vias, either V1-V2 or V3-V4 are electrically connected, and the other of the two pairs of vias remains disconnected. For example, vias V1 and V2 can be electrically connected and vias V3 and V4 disconnected, thereby forming zone of compensation $Z_{A2}$ from capacitors C1, C1', and C2. Or, vias V3 and V4 can be electrically connected and vias V1 and V2 disconnected, thereby forming zone of compensation $Z_{A2}$ from capacitors C1, C2, and C2'.

In instances where this embodiment is selected, the circuit board 132 is then tested, e.g. by a technician, to determine whether the crosstalk compensation provides for operation of the jack within specified tolerances over an entire specified frequency range. If so, the circuit board (and likely the lot of circuit boards) is deemed acceptable. If additional crosstalk compensation is required, the other pair of vias can be electrically connected, providing additional compensation across the 3-6 and 4-5 pairs. If too much crosstalk compensation has been applied, a technician can remove the electrical connection manufactured between the two connected vias.

In a further embodiment, the circuit board 132 is manufactured such that vias V1 and V2 are disconnected, and vias V3 and V4 are likewise disconnected. This corresponds to a situation in which the manufacturer intentionally attempts to "undershoot" the crosstalk compensation required in the circuit (e.g. as shown in FIG. 9B). The manufactured circuit boards are then tested to determine whether the crosstalk compensation of the boards, with capacitors C1' and C2' not included, is sufficient to ensure operation of the jack within specified tolerances over an entire specified frequency range. If insufficient crosstalk compensation is provided, a technician can electrically connect via V1 to V2 to add capacitor C1' to the crosstalk compensation arrangement. The technician could, in the alternative, connect via V3 to V4 to add capacitor C2' to the crosstalk compensation arrangement. If required, both pairs of vias could be connected to add both capacitors C1' and C2' to the crosstalk compensation arrangement.

In still another embodiment, the circuit board 132 is manufactured such that vias V1 and V2 are connected, and vias V3 and V4 are connected. This corresponds to a situation in which the manufacturer attempts to "overshoot" the crosstalk compensation required in the circuit, as described above in FIG. 9C. In such an embodiment, a technician can, after testing the circuit board and determining that too much compensation has been applied, remove electrical connections between the vias as required to provide a crosstalk compensation arrangement on the 3-6 and 4-5 pairs that operates within a desired tolerance.

In example embodiments, a crosstalk value in the range of 25 dB to 26 dB is desirable. Therefore, the values of the capacitors C1' and C2' are set such that the crosstalk changes by less than 1 dB. This ensures that, for circuit boards having a crosstalk value just outside of an acceptable range, an adjustment of the circuit board by connecting or disconnecting vias V1 and V2 or vias V3 and V4 provides an appropriate amount of capacitive compensation adjustment. In example embodiments in which a 1 dB crosstalk window is available for use of the circuit board, one or both of capacitors C1' and C2' provide a crosstalk change of approximately 0.8 dB, therefore providing a theoretical adjustable crosstalk range of about 24.2 dB to about 26.8 dB. Absent the adjustable nature of the circuit board, only boards within the range of 25 dB to 26 dB would be useable, leading to a higher circuit board failure rate.

In embodiments including additional crosstalk compensation components (e.g. capacitors C1" and C2", described above in conjunction with FIG. 9D) that can be selectively connected between the 3-6 and 4-5 pairs, additional numbers of capacitive couplings can be included, and can include a variety of values of capacitive compensation. In such arrangements, any of a number of the additional crosstalk compensation components can be manufactured to be connected in conjunction with capacitors C1 and C2, such that they can be selectively electrically connected or disconnected to allow fine-tuning of crosstalk capacitance after manufacturing is completed. Embodiments using more than one added, adjustable crosstalk compensation element are particularly useful in instances where additional variation in the crosstalk value must be accounted for, or in the case of a smaller pass band of acceptable crosstalk values (thereby dictating smaller-granularity adjustability of the secondary crosstalk compensation components).

For example, using the same available 1 dB pass band of acceptable crosstalk levels at 25 dB to 26 dB, by using four like capacitors which each affect crosstalk by 0.8 dB, crosstalk variance of about 23.4 dB to about 27.6 dB could be accounted for and adjusted after manufacturing. In such systems, as described above, zero or more of these selectively connected capacitive crosstalk compensation elements could be connected during manufacturing. In a particular embodiment, two of four selectively added capacitive crosstalk compensation elements are connected during manufacturing.

In a further example, using a narrower 0.5 dB pass band of acceptable crosstalk levels (e.g. between 25 dB and 25.5 dB), the selectively connectable capacitors (e.g. C1', C2') may affect crosstalk by approximately 0.4 dB. In such an example, to provide for a crosstalk variance of about 23.4 to about 27.6 dB or some similar range of possible crosstalk values, four secondary capacitive crosstalk compensation elements must be included in the circuit board. Other arrangements are possible as well, according to the considerations described herein.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. A method for compensating for crosstalk generated by one or more of a plurality of wire pairs in a telecommunications jack, the method comprising:
    manufacturing a circuit board having a zone of crosstalk compensation between a first wire pair and a second wire pair, the zone of crosstalk compensation including a capacitive coupling connected between the first wire pair and the second wire pair and a second capacitive coupling selectively connectable in parallel with the capacitive coupling;
    determining a crosstalk value generated by the jack including the manufactured circuit board;
    upon determining that the crosstalk value is outside of a crosstalk pass band, adjusting the zone of crosstalk compensation by altering an electrical connection between the second capacitive coupling and the capacitive coupling after the circuit board has been manufactured, thereby either adding or removing the second capacitive coupling to the zone of crosstalk compensation.

2. The method of claim 1, wherein altering the electrical connection includes forming an electrical connection between a via electrically connected to the capacitive coupling and a via electrically connected to the second capacitive coupling.

3. The method of claim 1, wherein altering the electrical connection includes disconnecting the electrical connection by electrically disconnecting a via electrically connected to the capacitive coupling from a via electrically connected to the second capacitive coupling.

4. The method of claim 3, wherein the crosstalk pass band is about 1 dB.

5. The method of claim 1, wherein determining the crosstalk value includes testing the jack to determine whether the crosstalk generated by the jack falls within the crosstalk pass band.

6. The method of claim 1, further comprising, after adjusting the zone of crosstalk compensation, redetermining a crosstalk value generated by the jack.

7. A crosstalk compensation arrangement for a telecommunications jack comprising:
    a circuit board;
    a plurality of contact springs mounted on the circuit board;
    a plurality of wire termination contacts mounted on the circuit board;
    a plurality of tracks on the circuit board that respectively electrically connect the contact springs to the wire termination contacts; and
    a crosstalk compensation arrangement including a zone of crosstalk compensation between a first wire pair and a second wire pair, the zone of crosstalk compensation including a capacitive coupling connected between the first wire pair and the second wire pair and a second capacitive coupling selectively connectable in parallel with the capacitive coupling by altering a connection between a via electrically connected to the capacitive coupling and a via electrically connected to the second capacitive coupling after the circuit board is manufactured, thereby either adding or removing the second capacitive coupling to the zone of crosstalk compensation.

8. The crosstalk compensation arrangement of claim 7, wherein the crosstalk compensation arrangement further includes a third capacitive coupling connected between the first wire pair and the second wire pair and a fourth capacitive coupling selectively connectable in parallel with the third capacitive coupling by altering a connection between a via electrically connected to the third capacitive coupling and a via electrically connected to the fourth capacitive coupling.

9. The crosstalk compensation arrangement of claim 8, further comprising a sixth capacitive coupling selectively connectable in parallel with the third capacitive coupling and the fourth capacitive coupling.

10. The crosstalk compensation arrangement of claim 7, wherein the contact springs include first, second, third, fourth, fifth, sixth, seventh and eighth consecutively arranged contact springs.

11. The crosstalk compensation arrangement of claim 10, wherein the wire termination contacts include first, second, third, fourth, fifth, sixth, seventh and eighth wire termination contacts for terminating wires to the jack.

12. The crosstalk compensation arrangement of claim 11, wherein the plurality of tracks includes first, second, third, fourth, fifth, sixth, seventh and eighth tracks that respectively electrically connect the first, second, third, fourth, fifth, sixth, seventh and eighth contact springs to the first, second, third, fourth, fifth, sixth, seventh and eighth wire termination contacts.

13. The crosstalk compensation arrangement of claim 12, wherein the capacitive coupling and the second capacitive coupling are connected between the third and fourth tracks.

14. The crosstalk compensation arrangement of claim 13, wherein the capacitive coupling and the second capacitive coupling are connected between the fifth and sixth tracks.

15. The crosstalk compensation arrangement of claim 7, wherein the capacitive coupling and the second capacitive coupling comprise a plurality of interdigitated fingers.

16. The crosstalk compensation arrangement of claim 7, further comprising a fifth capacitive coupling selectively connectable in parallel with the capacitive coupling and the second capacitive coupling.

17. The crosstalk compensation arrangement of claim 7, wherein an acceptable level of crosstalk generated by a telecommunications jack including the circuit board is about 25 dB to about 26 dB.

18. The crosstalk compensation arrangement of claim 17, wherein the second capacitive coupling provides alteration of the crosstalk by about 0.8 dB.

19. A telecommunications jack for use in a twisted pair system, the jack comprising:
    a housing defining a port for receiving a plug;
    a plurality of contact springs adapted to make electrical contact with the plug when the plug is inserted into the port of the housing;
    a plurality of wire termination contacts for terminating wires to the jack;
    a circuit board including conductive tracks that electrically connect the contact springs to the wire termination contacts; and
    a crosstalk compensation arrangement including a zone of crosstalk compensation between a first wire pair and a second wire pair, the zone of crosstalk compensation including a capacitive coupling connected between the first wire pair and the second wire pair and a second capacitive coupling selectively connectable in parallel with the capacitive coupling by altering a connection between a via electrically connected to the capacitive coupling and a via electrically connected to the second capacitive coupling after the circuit board is manufactured, thereby either adding or removing the second capacitive coupling to the zone of crosstalk compensation.

20. The telecommunications jack of claim 19, wherein the zone of crosstalk compensation corresponds to a second zone of crosstalk compensation between the first wire pair and the second wire pair.

* * * * *